United States Patent [19]

Nakajima

[11] Patent Number: 4,855,929
[45] Date of Patent: Aug. 8, 1989

[54] ROUTING METHOD FOR USE IN WIRING DESIGN

[75] Inventor: Yasuhiro Nakajima, Tokyo, Japan

[73] Assignee: NEC Corporation, Tokyo, Japan

[21] Appl. No.: 105,247

[22] Filed: Oct. 7, 1987

[30] Foreign Application Priority Data

Oct. 9, 1986 [JP] Japan .................... 61-241641

[51] Int. Cl.⁴ ............................................. G06F 15/20
[52] U.S. Cl. ...................................... 364/490; 364/489; 364/488
[58] Field of Search ................ 364/488, 489, 490, 491

[56] References Cited

U.S. PATENT DOCUMENTS

| | | | |
|---|---|---|---|
| 4,593,351 | 6/1986 | Hong et al. | 364/200 |
| 4,613,941 | 9/1986 | Smith et al. | 364/490 |
| 4,615,011 | 9/1986 | Linsker | 364/491 |
| 4,636,965 | 1/1987 | Smith et al. | 364/491 |
| 4,752,887 | 6/1988 | Kuwahara | 364/489 |

FOREIGN PATENT DOCUMENTS

| | | | |
|---|---|---|---|
| 0106070 | 6/1984 | Japan | 364/489 |
| 0008982 | 1/1985 | Japan | 364/489 |

OTHER PUBLICATIONS

"Connection Routing Algorithm For Pinted Circuit Boards", by Geyer, IEEE Transactions on Circuit Theory, vol. CT-18, No. 1, Jan. 1971 pp. 95-100.

"Introduction to VSLI Systems", Mead and Conway, Addison-Wesley Publishing Company, pp. 38-45, cover page and table of contents (1980).

He et al, "VLSI Circuit Layout, Theory and Design", IEEE Press, 1985 pp. 3-18.

Breuer, M. A., "Design Automation of Digital Systems,: Vol. 1, Theory and Techniques", Printice-Hall, Englewood Cliffs, N.J. pp. 312-326 (1972).

Breuer, et al "A Hardware Router", Journal of Digital Systems, vol. IV, issue 4, pp. 393-408 (1981).

Blank et al "A Parallel Bit Map Processor Architecture for DA Algorithms", 18th Design Automation Conference Proceedings, pp. 837-845 (1981).

Mikami et al "A Computer Program for Optimal Routing of Printed Circuit Conductors", believed to be 1968 IFIP Cong. pp. (H47-H50) 1475-1478 (1968).

Lee, C. Y., "An Algorithm for Path Connections and its Applications", IRE Transactions on Electronic Computers, believed to be vol. EC-10, No. 3, pp. 346-365 (1961).

*Primary Examiner*—Parshotam S. Lall
*Assistant Examiner*—V. N. Trans
*Attorney, Agent, or Firm*—Burns, Doane, Swecker & Mathis

[57] ABSTRACT

A routing method for wiring design including a determining step for identifying, in one of the wiring sections where no wiring path is determined as yet, the direction of the line segment which is prohibited by an obstacle and accordingly determining a wiring path. The routing method also includes a generating step for generating, on a layer opposite to the layer on which one unprocessed line segment is present and in a position having the same plane coordinates as the line segment, an obstacle which prohibits only such line segments as are parallel in direction to the line segment, on the wiring path determined by the determining step.

6 Claims, 11 Drawing Sheets

○ TOTAL PROHIBITION
△ X TRACK PROHIBITION
□ Y TRACK PROHIBITION

ROUTING METHOD FOR USE IN WIRING DESIGN

BACKGROUND OF THE INVENTION

The present invention relates to a routing method for use in automatically designing the wiring of printed wiring boards, large scale integrated circuit (LSI) chips or the like.

An example of a prior art routing method used for an automatic wiring design in computer-aided design (CAD) systems or the like is disclosed in the specification of the U.S. patent application Ser. No. 835,238 filed Mar. 3, 1986, now U.S. Pat. No. 4,752,887. The method described in the specification uses fixed obstacle data input at the time of initialization as wiring obstacle data for use in the search for a wiring path. According to this method, only total wiring prohibition data are set for the grid points of the wiring path positions discovered upon completion of the wiring of each segment. The data indicate the total impossibility of the wiring to proceed to such grid points.

Therefore, in designing the wiring of a printed wiring board or an LSI having two layers of wiring grids, even if some other wiring arrangement runs on one layer, a wiring arrangement can be routed on the other layer with complete freedom. As a result, there is the major disadvantage that the circuit may be caused to commit an error by a high level of crosstalk generated by the parallel running of wiring arrangements on the upper and lower layers, one having the same horizontal coordinates as the other.

An object of the present invention, therefore, is to provide a routing method free from the above-mentioned disadvantage.

SUMMARY OF THE INVENTION

According to one aspect of the present invention, there is provided a routing method for use in wiring design. The method comprises: a determining step for identifying, in one of the wiring sections where no wiring path is determined as yet, the direction of the line segment which is prohibited by an obstacle and accordingly determining a wiring path; and a generating step for generating, on a layer opposite to the layer on which one unprocessed line segment is present and in a position having the same plane coordinates as said line segment, an obstacle which prohibits only such line segments as are parallel in direction to said line segment, on the wiring path determined by said determining step.

BRIEF DESCRIPTION OF THE DRAWINGS

The features and advantages of the present invention will become apparent from the following description when taken in conjunction with the accompanying drawings, wherein:

FIGS. 9a to 16b illustrate the states of a grid map;

In the drawings, the same reference numerals denote the same structural elements, respectively.

DETAILED DESCRIPTION OF A PREFERRED EMBODIMENT

Now will be described in detail a preferred embodiment of the present invention with reference to the accompanying drawings.

Figure 1:
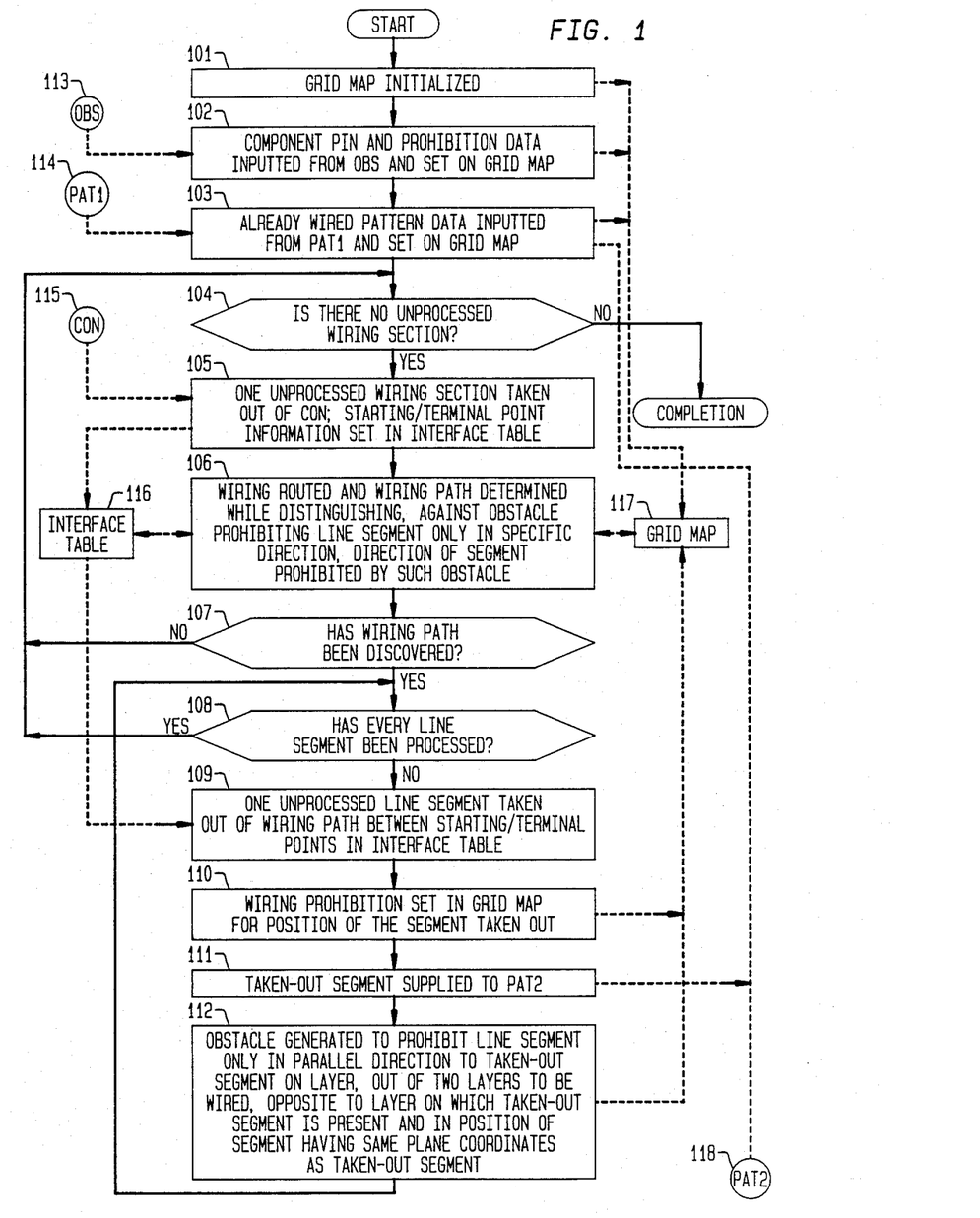
FIG. 1 is a flow chart of a preferred embodiment of the invention.

Referring to FIG. 1, the embodiment comprises a grid map 117 for indicating wiring prohibition data at 6×6 grid points to show a wiring path on a substrate; a processing module 101 for initializing the grid map 117; a processing module 102 for providing, in such positions in the grid map 117 as are calculated on the basis of component pin data given from a file OBS 113, wiring prohibition data, x track prohibition data and y track prohibition data given from the file OBS 113; a processing module 103 for setting, in the grid map 117 as obstacle information, routing data which, given from a file PAT1 114, indicate a path to be secured in advance as an already wired part, and setting in the grid map 117 x track prohibition data or y track prohibition data for prohibiting the running of wiring in the same direction as that of routing data running on the layer opposite to the layer on which said routing data are present; a processing module 104 for judging the presence or absence of a still unprocessed wiring section; a processing module 105 for entering a set of unprocessed wiring section data including the grid point positional information of the starting point and that of the terminal point, and setting them in an interface table 116; a processing module 106 for finding a wiring path while evading obstacles by referring to the grid map 117 on the basis of wiring data from the interface table 116 and responsive to the discovery of a wiring path for storing in the interface table 116 routing data for the discovered wiring path, consisting of plural sets of grid point positional information; a processing module 107 for judging whether or not a wiring path was discovered in the processing module 106; a processing module 108 responsive to the judgment in the processing module 107 of the discovery of a wiring path for judging the presence or absence of unprocessed line segment data in the wiring data of the interface table 116; a processing module 109 responsive to the judgment in the processing module 108 of the presence of unprocessed line segment data for taking out unprocessed line segment data from the interface table 116; a processing module 110 for setting line segment data in the grid map 117 as obstacles to the routing of wiring; a processing module 111 for supplying line segment data as a wiring result to a file PAT2 118; and a processing module 112 for setting in the grid map 117 track prohibition data to prohibit wiring in the same direction as line segment data on the layer opposite to the layer on which the line segment data are present and shifting control to the processing module 108.

Next, the operation of the preferred embodiment of the invention will be described in detail with reference to FIGS. 1 through 18.

Referring first to FIG. 1, solid arrows represent the sequence of processing and broken arrows, the flow of data.

By the processing module 101 are initialized memory positions in a region on a memory allocated for the grid map 117. Thus, in the upper layer of the 6×6 grid map shown in FIG. 9a and the lower layer of same shown in FIG. 9b, the upper levels (i.e. LA 501 in FIG. 5) and the lower levels (i.e. MS 502 in FIG. 5) in the squares, each representing a grid point in the grid map, are all set to "0". As a result, every grid point is vacated.

Then in the processing module 102, various data are entered from the file OBS 113. Out of these data, component pin data include grid point positional information (m, n, z), and a pin is provided in the position indicated by this set of grid point positional information. From the grid point positional information of pin data is calculated an address {A+(z−1)×B+(m−1)×C+(n−1)}. Corresponding grid point data in the grid map 117 are designated according to the result of this calculation. In the field LA 501 of the thereby designated grid point data is set a value "11". The x track prohibition data include the above-mentioned positional information, and a value "01" is set in the field LA 501 of the grid point data designated by the grid point positional information. The y track prohibition data include the above-mentioned positional information, and a value "10" is set in the field LA 501 of the grid point data designated by the grid point positional information. By this processing module 102 are set wiring prohibition data (1, 1, 1), (1, 1, 2), (1, 2, 1), (1, 2, 2), (1, 3, 1), (1, 3, 2), (1, 4, 1), (1, 4, 2), (1, 5, 1), (1, 5, 2), (1, 6, 1), (1, 6, 2), (2, 1, 1), (2, 1, 2), (3, 1, 1), (3, 1, 2), (4, 1, 1), (4, 1, 2), (5, 1, 1), (5, 1, 2), (6, 1, 1), (6, 1, 2), (6, 2, 1), (6, 2, 2), (6, 3, 1), (6, 3, 2), (6, 4, 1), (6, 4, 2), (6, 5, 1), (6, 5, 2), (6, 6, 1), (6, 6, 2), (2, 6, 1), (2, 6, 2), (3, 6, 1), (3, 6, 2), (4, 6, 1), (4, 6, 2), (5, 6, 1) and (5, 6, 2) and component pin data (2, 5, 1), (2, 4, 1), (5, 4, 1), (5, 2, 1), (3, 2, 2) and (4, 5, 2) as "11" in the upper levels (LA 501 shown in FIG. 5) in the squares, each represented by a grid point in the upper layer of the 6×6 grid map shown in FIG. 10a and the lower layer of the 6×6 grid map shown in FIG. 10b. By this same processing module 102 are set wiring prohibition data 701, as in FIGS. 10a and 10b, on the 6×6 grid map shown in FIG. 7.

Now, grid points where wiring prohibition data are set function as an obstacle to prohibit the running of wiring in all directions. Grid points where x track prohibition data and y track prohibition data are set serve as obstacles to prohibit the running of wiring in the x direction and the direction perpendicular thereto, respectively. It of course is possible, where wiring is permitted in an oblique direction, i.e. a direction not perpendicular to the x direction, to set obstacles to prohibit the running of wiring in the oblique direction. For the sake of simplified explanation, however, the following description will concern a case in which the running of wiring is limited to the x and y directions.

In the processing module 103, routing data from the file PAT1 114 are set on the grid map 117 as obstacle information. Thus, a value "11" is set in the LA 501 of the corresponding grid data group on the grid map 117. Further, either x track prohibition data or y track prohibition data are set as "01" or "10" in the corresponding grid date group on the grid map 117. The x track prohibition data or the y track prohibition data set here are intended to prohibit the running of a path, on the layer opposite to that where routing data are present, in the same direction as the running direction of the routing data. In this processing module 103, "11" is set in the upper level LA 501 of the square of each grid point in the upper layer of the 6×6 grid map shown in FIG. 11a and the lower layer of the 6×6 grid map shown if the data are (2, 4, 1), (3, 4, 1), (4, 4, 1) or (5, 4, 1), or "01" is set there if the data are (2, 4, 2), (3, 4, 2), (4, 4, 2) or (5, 4, 2). In the state illustrated in FIG. 7, wiring prohibition 704 and x track prohibition 703 are set.

Figure 12A:
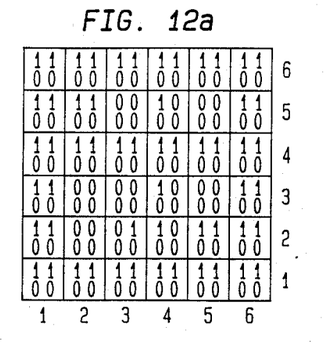
Figure 12B:
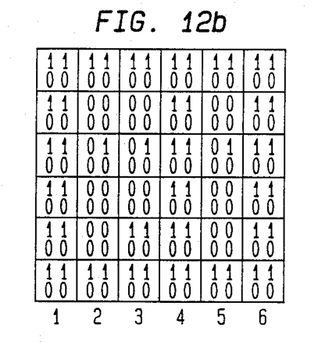

Similarly in the processing module 103, "11" is set in the upper lever LA 501 of the square of each grid point in the upper layer of the 6×6 grid map shown in FIG. 12a and the lower layer of the 6×6 grid map shown in FIG. 12b if the data are (4, 5, 2), (4, 4, 2), (4, 3, 2), (4, 2, 2) or (3, 2, 2), "10" is set if the data are (4, 5, 1), (4, 3, 1) or (4, 2, 1), or "01" is set if the data are (3, 2, 1). In the state illustrated in FIG. 7, wiring prohibition 705, x track prohibition 706 and y track prohibition 702 are set.

Then in the processing module 104 is judged the presence or absence of ay unprocessed wiring section. Processing is completed if no unprocessed wiring section is judged to be present. In response to an affirmative judgment, the control is shifted to the processing module 105.

In this processing module 105, a set of wiring section data including the grid point positional information of the starting point and that of the terminal point from the file CON 115 is entered and set on the interface table 116.

Next will be described the operation in the processing module 106 in detail with reference to FIGS. 2, 3 and 4.

Figure 2:
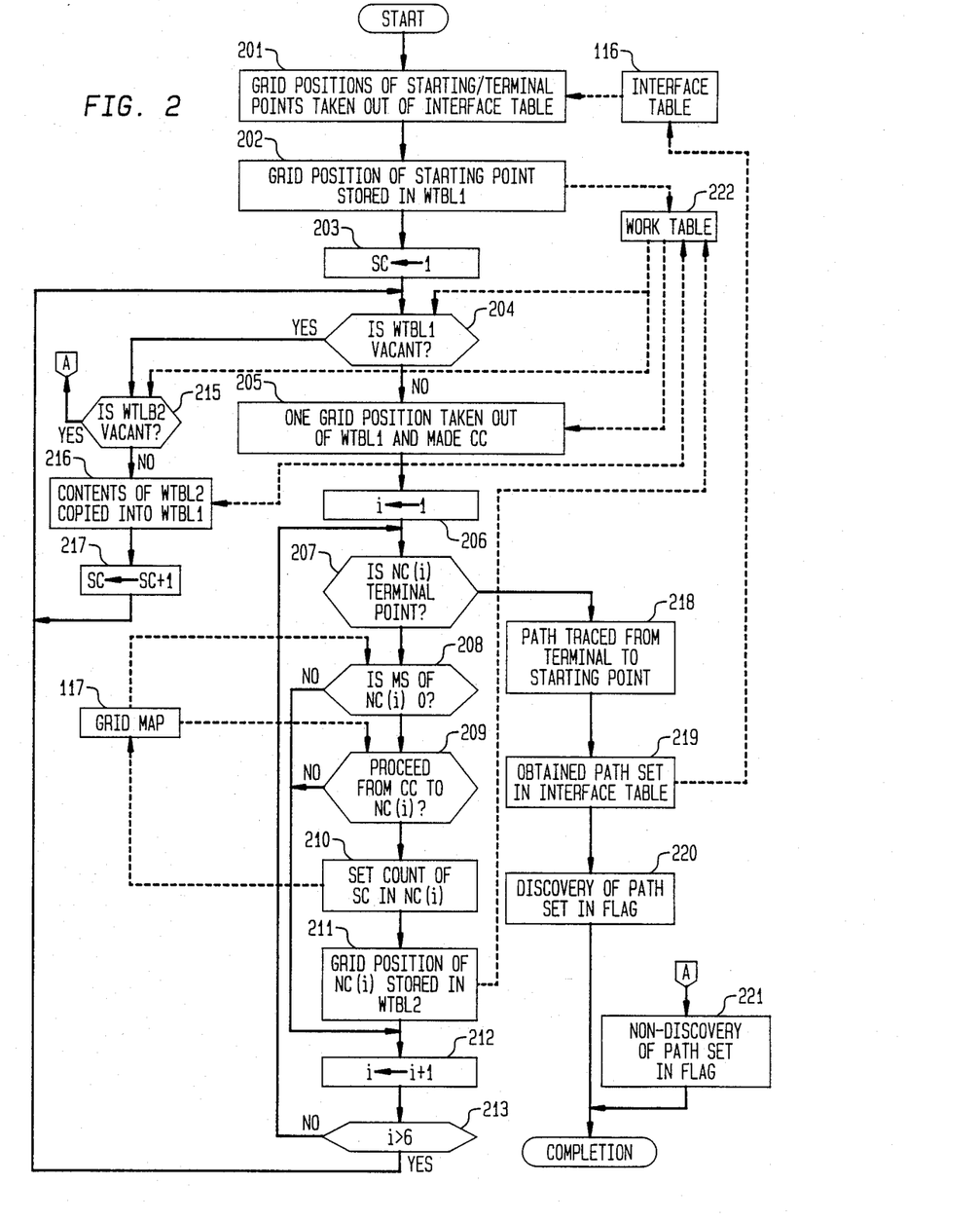
FIG. 2 is a flow chart of processing in Process Box 106 of FIG. 1.
Figure 3:
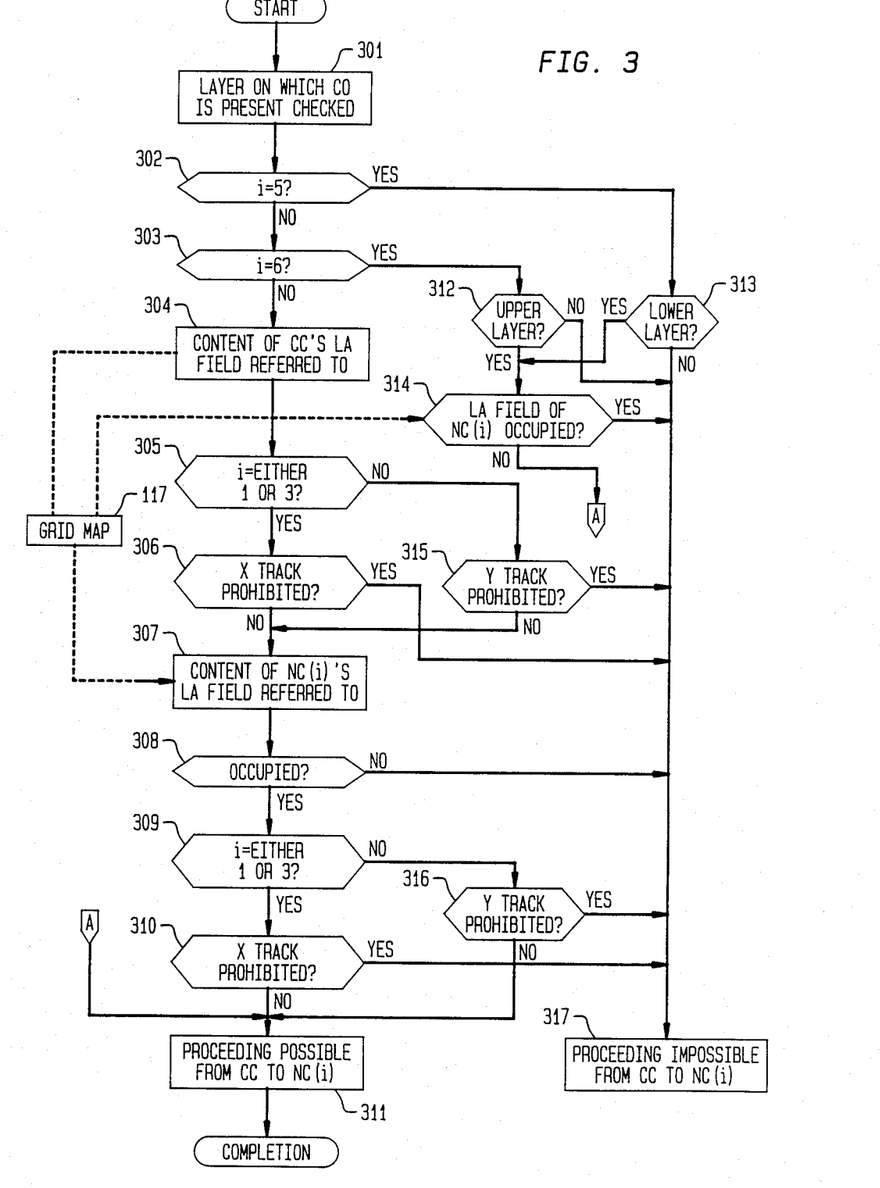
FIG. 3 is a flow chart of processing in Process Box 209 of FIG. 2.
Figure 17:
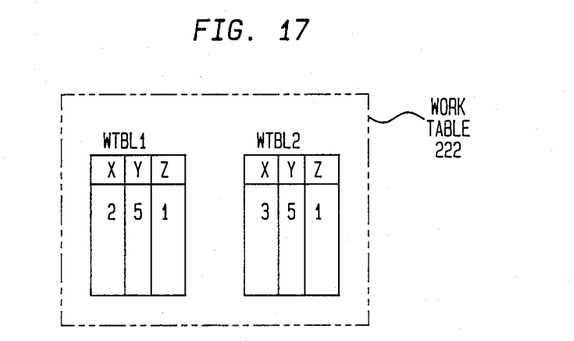
FIG. 17 illustrates the states WTBL1 and WTBL2 of the work table 222 corresponding to the states of the grid map shown in FIGS. 13a and 13b, respectively.

Referring now to FIG. 2, first in the processing module 201, the positional information of the starting grid point is taken out of the interface table 116. Then in the processing module 202, this starting point positional information is stored in a work table 222 WTBL1. The work table 222 WTBL1 here is a table provided in a memory for storing the positional information of the grid point which constitutes the origin of search at each step. If the starting point to be wire-connected is to be, for example, (2, 5, 1) and the terminal point, (5, 2, 1), the starting point (2, 5, 1) will be stored, as shown in FIG. 17, in the work table 222 WTBL1, in the processing modules 201 and 202.

Next, in the processing module 203, "1" is set in a step counter SC. Then, in the processing module 204 it is judged whether or not the work table 222 WTBL1 has been vacated. In response to an affirmative judgment, there is achieved branching to the processing module 215. Further it is judged in the processing module 215 whether or not a work table 222 WTBL2 has been vacated. The work table 222 WTBL2 here is a table provided for storing the positional information on all adjacent gridpoints connectable to each grid point whose positional information is stored in the work table 222 WTBL1.

In response to a judgment in the processing module 215 that the work table 222 WTBL2 is vacated, the control is shifted to the processing module 221. In this module 221 is set a flag indicating a failure to discover a path, and the processing is completed. This means a deadlock in the routing process.

If it is judged in the processing module 215 that the work table 222 WTBL2 is not vacant, all the contents of the work table 222 WTBL2 are once copied by the work table 222 WTBL1 in the processing module 216, and then the copied contents are removed from the work table 222 WTBL1.

Then, in the processing module 217, the step counter SC is counted up, followed by branching to the processing module 204.

Figure 4:
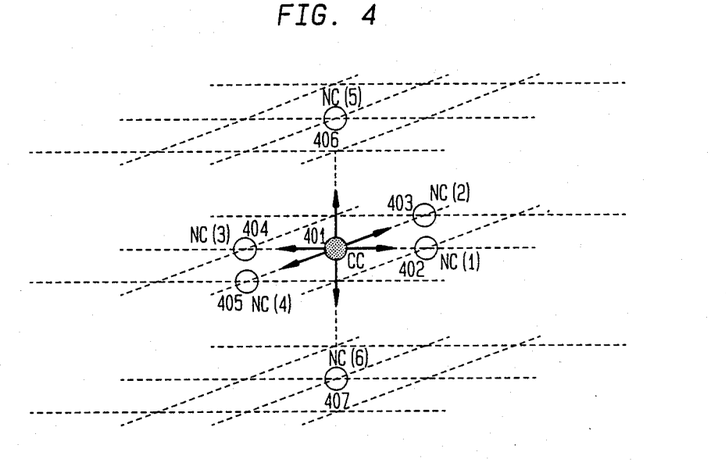
FIG. 4 illustrates one grid point and other grid points adjacent thereto.

In response to a judgment that the work table 222 WTBL1 is not vacant in the processing module 204, a set of grid point positional information is taken out of the work table 222 WTBL1 in the processing module 205, and the pertinent grid point is made CC 401 of FIG. 4. The positional information taken out is removed from the work table 222 WTBL1.

Next, in the processing module 206, "1" is set as i.

Then, in the judgment module 207, it is judged whether or not the positional information at grid points NC(i) 402 to 407 in FIG. 4 is consistent with the terminal grid point. In response to an affirmative judgment, the path is traced in the processing module 218 from the terminal to the starting grid point. In the processing module 219, the wiring path data obtained by the processing in the processing module 218 are set in an interface table 214. In the upper layer of the 6×6 grid map shown in FIG. 12a and the lower layer of the 6×6 grid map shown in FIG. 12b, the data for the grid point NC(1) 402 are (3, 5, 1) in FIG. 4 when those for the grid point CC 401 are (2, 5, 1). Since the grid point NC(1) 402 is not equal to the terminal point (5, 2, 1), the control is shifted to the processing module 208. Meanwhile in the upper layer of the 6×6 grid map shown in FIG. 15a and the lower layer of the 6×6 grid map shown in FIG. 15b, the data for the grid point NC(4) 405 are (5, 2, 1) in FIG. 4 when those for the grid point CC 401 are (5, 3, 1), namely equal to those of the terminal point, (5, 2, 1). Therefore, the path is traced in the processing module 218 from the terminal to the starting grid point. Thus, the path is traced in the direction in which the flag MS 502 for the lower level in the square representing a grid point in the grid map becomes smaller, via the points (5, 2, 1), (5, 3, 1), (4, 3, 1), (3, 3, 1), (3, 3, 2), (3, 4, 2), (3, 5, 2), (3, 5, 1) and (2, 5, 1).

A flag is set in the processing module 220 to indicate the fact of having found a path, and the processing is thereby completed.

If none of the grid points NC(i) 402 to 407 is found to be the terminal grid point, it is judged in the processing module 208 whether or not the routing completion flag MS 502 for the grid points NC(i) 402 to 407 is "0". In response to a judgment in the processing module 208 to affirm the completion of routing, the control is shifted to the processing module 212. If the judgment in the processing module 208 is negative, the control is shifted to the processing module 209. In the upper layer of the 6×6 grid map shown in FIG. 12a and the lower layer of the 6×6 grid map shown in FIG. 12b, the data for a grid point NC(i) of i=1, i.e. for the grid point NC(1) 402, in FIG. 4 are (3, 5, 1) when those for the grid point CC 401 are (2, 5, 1). However, as the routing completion flag MS 502 for the lower level in the square representing this grid point is "0", the control is shifted to the processing module 209.

In the processing module 209 is judged whether the routing is to be proceeded from the grid point CC 401 to any of the grid points NC(i) 402 to 407, all shown in FIG. 4.

Next will be described in detail this judgment processing with reference to FIGS. 3, 4 and 5.

First the premises of this judgment processing will be explained with reference to FIGS. 4 and 5.

FIG. 4 illustrates the grid point CC 401 now under consideration and the grid points NC(i) i=1 to 6 402 to 407 adjacent to the grid point CC 401. The letter i indicates the direction, and when i is 1, 2, 3, 4, 5 and 6, the direction is right, upward, left, downward, forward and backward, respectively.

Figure 5:
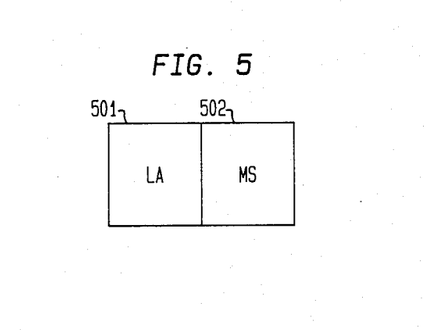
FIG. 5 illustrates a format of grid point data.

FIG. 5 shows an example of bit composition of grid point data, representing the state of each grid point in the grid map 117. Here, eight bits are assigned for each grid point datum. The two-bit state field LA 501 of a grid point datum is used for indicating the occupancy/vacancy state of the grid point, and can represent one of the following four possible states.

00: vacant
01: x track prohibited (wiring should not run in the x direction)
10: y track prohibited (wiring should not run in the y direction)
11: already occupied (occupied by a component pin, wiring prohibition, a wired path or the like)

The six-bit marking field MS 502 can be freely used in routing the wiring, and for different purposes depending on the wiring method.

Now, the processing to decide whether or not to advance the routing from the current position, the grid point CC 401, to one of the adjacent grid points NC(i) {i=1 to 6} 402 to 407 will be described in detail with reference to FIG. 3.

The following description, for example, relates to the case where it is to be decided whether or not to advance the routing from the grid point CC 401 to one of its adjacent grid points, NC(1) 402 (i.e. i=1).

First in the processing module 301 is checked whether a grid point in the grid map 117 corresponding to the grid point CC 401 is on the upper or lower layer of the wiring grid. It is seen that, in the upper layer of the 6×6 grid map of FIG. 12a and in the lower layer of the 6×6 grid map of FIG. 12b, when the data for the grid point CC 401 are (2, 5, 1), this grid point CC 401 is on the upper layer.

Then, in the processing module 302, it is judged whether or not i is five, and if not, the control is shifted to the processing module 303.

In the processing module 303, it is judged whether or not i is six, and in response to a negative judgment the control is shifted to the processing module 304.

In the processing module 304 is referred to the content of the field LA 501, in which the occupancy/vacancy state, out of the grid point data in the grid map 117 corresponding to the grid point CC 401, is stored. In the state represented by FIGS. 12a and 12b, the value of the LA 501 on the upper level of the square corresponding to the grid point CC 401 (2, 5, 1) is "11".

Then, as i is one, the control is shifted to the processing module 306 via the processing module 305.

If the code "01" indicating x track prohibition is stored in the LA 501 representing the data for the grid point CC 401 in the processing module 306, the control is further shifted to the processing module 317, resulting in a judgment that proceeding from the grid point CC 401 to one of the adjacent grid points NC(1) 402 is impossible. Such a state occurs when the routing proceeded from another adjacent grid point NC(2) 403 or NC(4) 405 to the grid point CC 401 in the immediately proceding processing and, after altering the running direction at the grid point CC 401, is intended to proceed from still another adjacent grid point NC(1) 402 in the current processing.

On the other hand, if the content of the LA 501 representing the data for the grid point CC 401 is not a code indicating x track prohibition, the control is shifted to the processing module 307, in which the content of the field LA 501 in the grid map 117, where the occupancy/vacancy state of the adjacent grid point NC(1) 402 is stored, is referred to, and the control is further shifted to the processing module 308. Since the content of the LA 501 corresponding to the grid point CC 401 in the instance illustrated by FIGS. 12a and 12b is "11", the control is shifted to the processing module 307, and the content of the LA 501 corresponding to the adjacent grid point NC(1) 402 (3, 5, 1) turns out to be "00".

If the code "11" indicating an occupied state is stored in the LA 501 for the adjacent grid point NC(1) 402, the control is shifted to the processing module 317, resulting in a judgment that proceeding from the grid point CC 401 to the adjacent grid point NC(1) 402 is impossible.

On the other hand, if the content of the LA 501 representing the data for the adjacent grid point NC(1) 402 is not a code indicating an occupied state, the control is shifted to the processing module 310 via the processing module 309. Since the content of the LA 501 corresponding to the adjacent grid point NC(1) 402 (3, 5, 1) in the instance illustrated in FIGS. 12a and 12b is "00", which does not indicate an occupied state, the control is shifted to the processing module 310.

If the code "01" indicating x track prohibition is stored in the LA 501 representing the data for the adjacent grid point NC(1) 402, the control is shifted to the processing module 317, resulting in a decision that proceeding from the grid point CC 401 to the adjacent grid point NC(1) 402 is impossible.

On the other hand, if the content of the LA 501 representing the data for the adjacent grid point NC(1) 402 is not a code indicating x track prohibition, the control is shifted to the processing module 311, resulting in a decision that proceeding from the grid point CC 401 to the adjacent grid point NC(1) 402 is possible. The content of the LA 501 corresponding to the adjacent grid point NC(1) 402 (3, 5, 1) in the instance illustrated in FIGS. 12a and 12b is "00", which does not indicate x track prohibition. Therefore, the resulting judgment is that proceeding is possible from the grid point CC 401 (2, 5, 1) to the adjacent grid point NC(1) 402 (3, 5, 1).

Whereas the foregoing description traced the flow chart only with respect to whether or not proceeding was possible to one of the adjacent grid points NC(1) 402, judgment as to the possibility of proceeding to other adjacent grid points NC(2) 403, NC(3) 404 and NC(4) 405 can be achieved in a similar manner.

Judgment processing for the adjacent grid points NC(5) 406 and NC(6) 407 will now be described in detail below.

For the NC(5) 406, where i=5, the control is shifted from the processing module 302 to the processing module 313.

If the grid point CC 401 is on the upper layer, a judgment is given in the processing module 317 that proceeding from the grid point CC 401 to the adjacent grid point NC(5) 406 is impossible.

Where the grid point CC 401 is on the lower layer, the control is shifted to the processing module 314, and if the code "11" indicating an occupied state is judged to be stored in the LA 501 of the adjacent grid point NC(5) 406, the control is shifted to the processing module 317, where a judgment is obtained that proceeding from the grid point CC 401 to the adjacent grid point NC(5) 406 is impossible.

If the code "11" indicating an occupied state is not stored in the LA 501 of the adjacent grid point NC(5) 406, the control is shifted to the processing module 311, and a judgment is given that proceeding is possible from the grid point CC 401 to the adjacent grid point NC(5) 406.

A judgment as to the possibility of proceeding to the adjacent grid point NC(6) 407 can be achieved in a similar manner. If the data for the grid point CC 401 are (2, 5, 1) in the state illustrated in FIGS. 12a and 12b, proceeding from the grid point CC 401 to the adjacent grid point NC(5) 406 is impossible because i=5 and the grid point CC 401 is on the upper layer. Proceeding from the grid point CC 401 to the adjacent NC(6) 407, meanwhile, is possible because i=6, the grid point CC 401 is on the upper layer and the value of the LA 501 corresponding to the adjacent grid point NC(6) 407 (2, 5, 2) is "00".

Accordingly, if the data for the grid point CC 401 are (2, 5, 1) and i=1 in the upper and lower layers of the 6×6 grid map of FIGS. 12a and 12b, those for the adjacent grid point NC(1) 402 are (3, 5, 1). In this case, because of the foregoing explanation, it is judged that proceeding is possible from the grid point CC 401 to the adjacent grid point NC(1) 402.

Figure 13A:
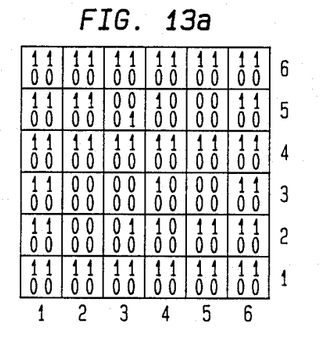
Figure 13B:
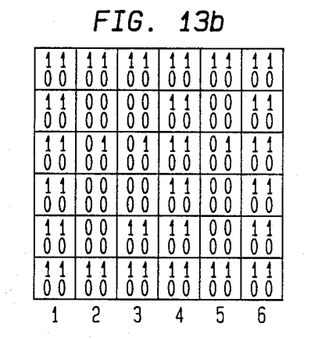
Figure 14A:
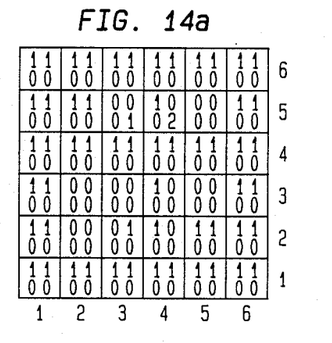
Figure 14B:
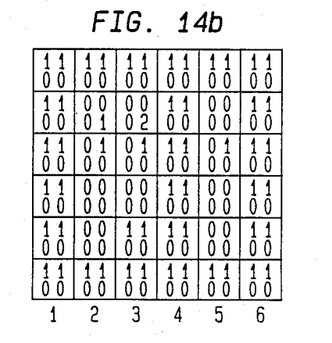
Figure 15A:
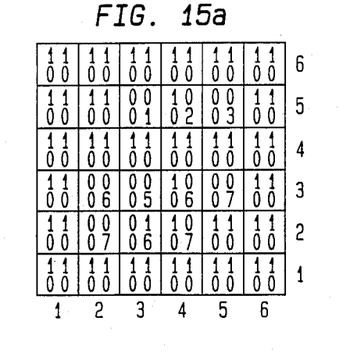
Figure 15B:
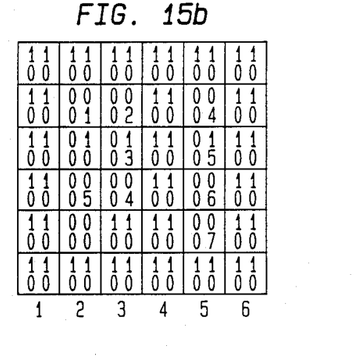
Figure 16A:
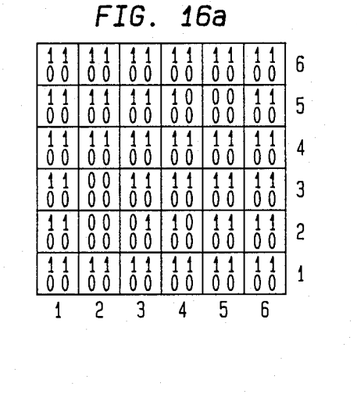
Figure 16B:
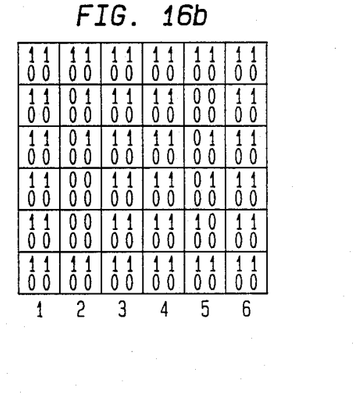

Referring again to FIG. 2, when routing is to proceed to one of the adjacent grid points NC(i) 402 to 407, the count of the step counter SC is set in the routing completion flag MS 502 for the data corresponding to the pertinent one of the adjacent grid points NC(i) 402 to 407 in the processing module 210. In the processing module 211, the positional information for the pertinent one of the adjacent grid points NC(i) 402 to 407 is stored in the work table 222 WTBL2, resulting in proceeding from the grid point CC 401 to the adjacent grid point NC(1) 402 in the upper and lower layers of the 6×6 grid map of FIGS. 12a and 12b, respectively. Therefore, "1" is set in the routing flag MS 502 on the lower level of the square representing the adjacent grid point NC(1) 402 (3, 5, 1), because the CC 401 is starting point, i.e. SC=1. The set state is indicated in FIGS. 13a and 13b. Further, the data (3, 5, 1) for the adjacent grid point NC(1) 402 are stored in the work table 222 WTBL2. The state of the work table 222 WTBL2 at this time is shown in FIG. 17. When proceeding to none of the adjacent grid points NC(i) 402 to 407 is possible, the control is shifted to the processing module 212.

Figure 18:
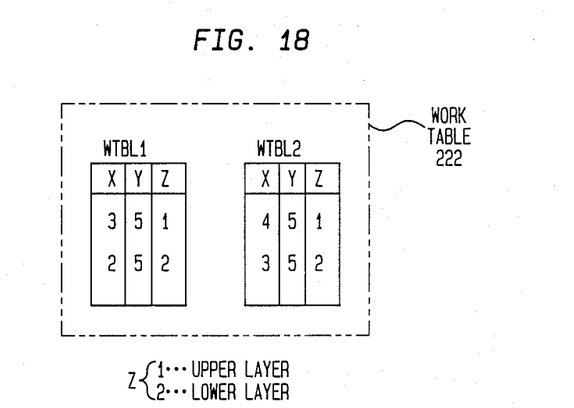
FIG. 18 illustrates the states WTBL1 and WTBL2 of the work table 222 corresponding to the states of the grid map shown in FIGS. 14a and 14b.

In the processing module 212, the value of i is counted up. Next in the processing module 213 is judged whether or not the value of i has exceeded six. If the judgment is affirmative, the control is shifted to the processing module 204, or if it is negative, the control is shifted to the processing module 207. The upper and lower layers of the 6×6 grid map shown in FIG. 14a and 14b, respectively, indicate the state of the flag MS 502 for each grid point when the values in the work tables 222 WTBL1 and WTBL2 with respect to the grid point CC 401 (3, 5, 1) are as shown in FIG. 18.

Whereas the step counts used in the processing flow are set in the grid map 117 for use in the path tracing, it has been demonstrated that their validity are not lost even if they are simplified to 1, 1, 2, 2, 1, 1, . . . for the sake of memory saving.

Referring back to FIG. 1, in the processing module 106, the grid map 117 is referred to with respect to the above-mentioned wiring section data from the interface table 116, and the wiring path is searched for while evading obstacles. In response to the discovery of a wiring path, routing data for the discovered wiring path, consisting of a plurality of grid point positions, are stored in the interface table 116.

In the processing module 107, it is judged whether or not a wiring path was found in the processing module 106. In response to an affirmative judgment, the control is shifted to the processing module 108, or if the judgment is negative, the control is returned to the processing module 104.

In the processing module 108, it is judged whether or not unprocessed line segment data are present among the routing data of the interface table 116. In response to a negative judgment, the control is returned to the processing module 104. If the judgment is affirmative, the control is shifted to the processing module 109, where unprocessed line segment data are taken out of the interface table 116, followed by the shifting of the control to the processing module 110.

In the processing module 110, the line segment data are set in the grid map 117 as obstacles to routing for wiring, and the control is shifted to the processing module 111. By the processing in this processing module 110, "11" is set in the positions indicated by (2, 5, 1), (3, 5, 1), (3, 3, 1), (4, 3, 1), (5, 3, 1), (5, 2, 1), (3, 5, 2), (3, 4, 2) and (3, 3, 2) of the LA 501 of the upper level in the squares each representing a grid point in the upper and lower layers of the 6×6 grid map shown in FIGS. 16a and 16b, respectively. Similarly, wiring prohibition 806 is set in the grid illustrated in FIG. 8.

In the processing module 111, the line segment data are supplied to the PAT2 118 as the result of wiring, and the control is shifted to the processing module 112.

Processing in this processing module 112 will be described in detail below with reference to FIG. 6.

Figure 6:
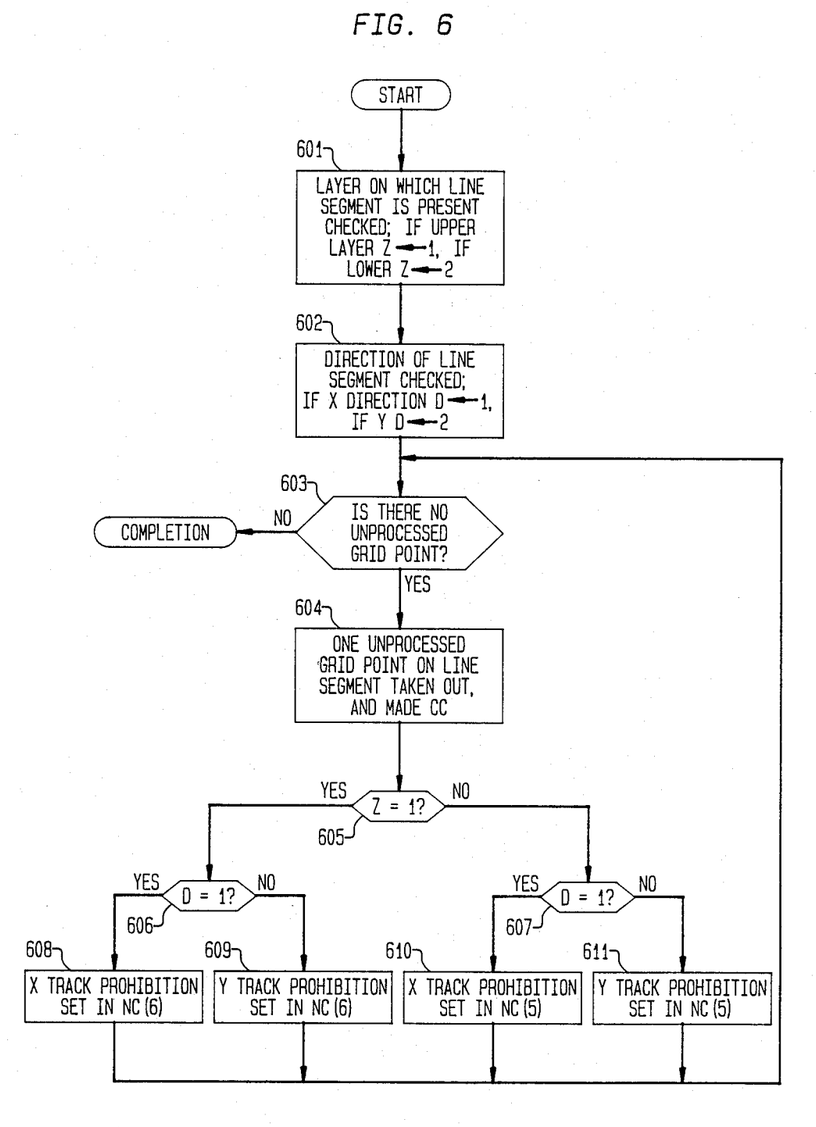
FIG. 6 is a flow chart of processing in Process Box 112 of FIG. 1.
Figure 7:
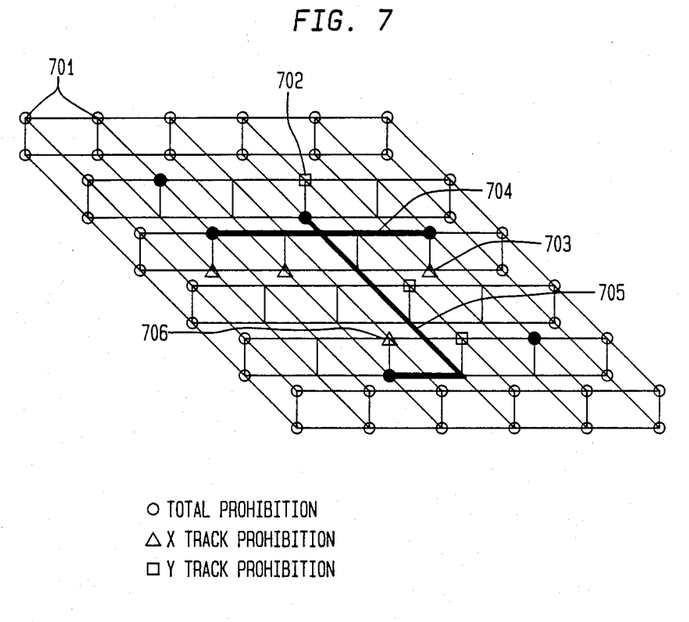
FIGS. 7 and 8 are typical wiring model diagrams for describing a state in which prohibition data are set and the result of wiring path routing, respectively.

Referring to FIG. 6, first in the processing module 601, it is checked whether the grid points constituting the inputted line segment belong to the upper layer or the lower layer of the wiring grid. If it is found belonging to the upper layer, "1" is set in a layer flag z, or if it belongs to the lower layer, "2" is set in the layer flag z. If (2, 4, 1), (3, 4, 1), (4, 4, 1) and (5, 4, 1) shown in FIGS. 11a and 11b constitute the inputted line segment, this segment belongs to the upper layer, so that "1" is set in the layer flag z.

Then in the processing module 602, the direction of the inputted line segment is checked. If it is in the x direction, "1" is set in a direction flag D, or if it is in the y direction, "2" is set in the direction flag D. If (2, 4, 1), (3, 4, 1), (4, 4, 1) and (5, 4, 1) shown in FIGS. 11a and 11b constitute the inputted line segment, this segment is in the x direction, so that "1" is set in the direction flag D.

Next in the processing module 603, all the grid points on the inputted line segment are subjected to a judgment as to whether or not they are unprocessed. In response to a negative judgment, the processing is completed. If the judgment is affirmative, the control is shifted to the processing module 604.

In the processing module 604, one of the unprocessed grid points on the inputted line segment is taken out, and is made the grid point CC 401. Where the positions (2, 4, 1), (3, 4, 1), (4, 4, 1) and (5, 4, 1) constitute the inputted line segment, (2, 4, 1) is the grid point CC 401.

Figure 11A:
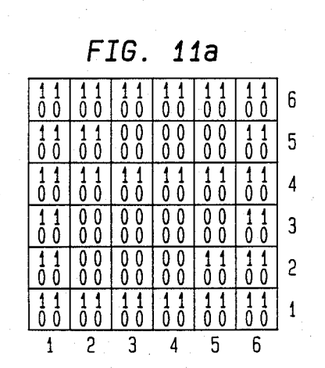
Figure 11B:
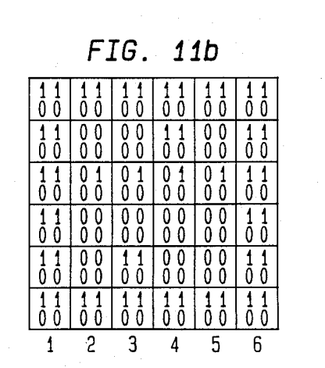

Then in the processing module 605 is judged whether or not the layer flag z is set to "1". In response to a judgment that the layer flag z is set to "1", the control is shifted to the processing module 606. If the layer flag z is found set to "0", the control is shifted to the processing module 607. If the prevailing state is as shown in FIGS. 11a and 11b, "1" was set in the layer flag z in the processing module 601, so that the control is shifted to the processing module 606.

In the processing module 606 it is judged whether or not the direction flag D is set to "1". In response to a judgment that the direction flag D is set to "1", the code "01" indicating x track prohibition is set in the LA 501 of the adjacent grid point NC(6) 407 in the processing module 608. If the direction flag D is found set to "0", the code "10" indicating y track prohibition is set in the LA 501 of the adjacent grid point NC(6) 407 in the processing module 609. If the prevailing state is as shown in FIGS. 11a and 11b, "1" was set in the processing module 602, so that the code "01" is set for the adjacent grid point NC(6) 407 (2, 4, 2).

Then in the processing module 607 it is judged whether or not the direction flag D is set to "1". In response to an affirmative judgment, the code "01" indicating x track prohibition is set in the LA 501 of the adjacent grid point NC(5) 406 in the processing module 610. If the direction flag D is set to "0", the code "10" indicating y track prohibition is set in the LA 501 of the adjacent grid point NC(5) 406 in the processing module 611. After the completion of each of the processing modules 608, 609, 610 and 611, the control is shifted to the processing module 603.

Figure 8:
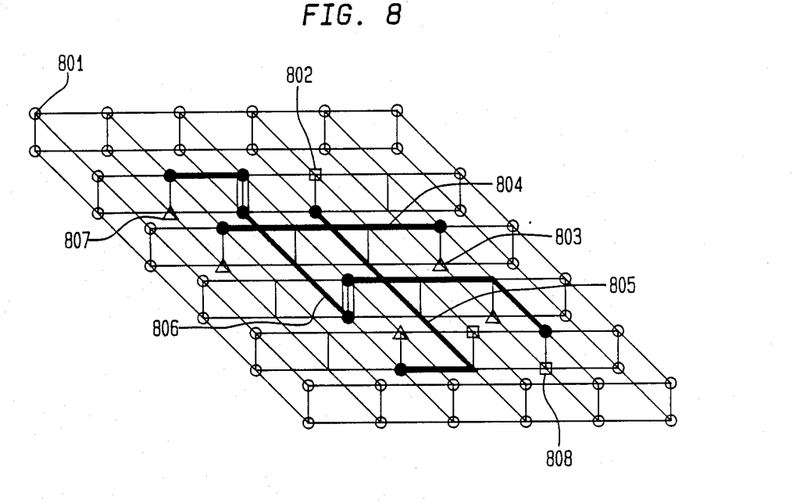
Figure 9A:
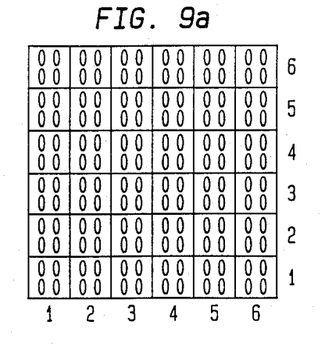
Figure 9B:
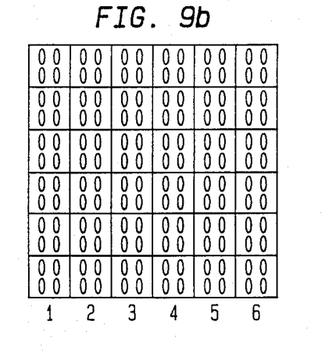
Figure 10A:
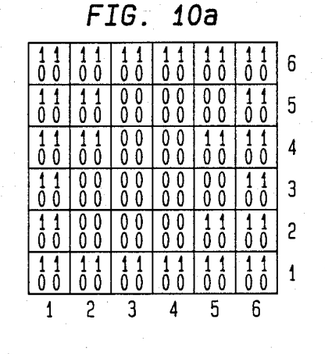
Figure 10B:
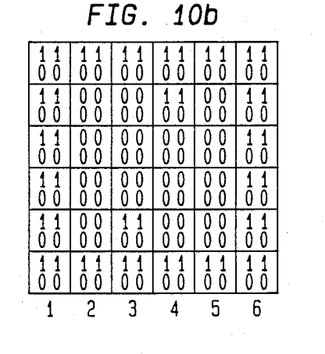

Referring again to FIG. 1, in the processing module 112, track prohibition data to prohibit wiring in the same direction as the line segment data on the layer opposite to that on which the line segment data are present is set in the grid map 117 as mentioned above, and the control is shifted to the processing module 108. By the processing module 112, in the LA 501 of the upper level in the squares each representing a grid point in the upper and lower layers of the 6×6 grid map shown in FIGS. 16a and 16b, respectively, is set "01" if the data are (2, 5, 2) or (5, 3, 2), or "10" is set if they are (5, 2, 2). In the grid illustrated in FIG. 8 are set x track prohibition 807 and y track prohibition 808.

Wiring substrates whose wiring is designed in this manner can be manufactured by the use of a manufacturing technique commonly used for printed wiring boards, ceramic wiring boards and integrated circuits. For this manufacturing technique, reference may be made to C. Mead and L. Conway, "Introduction to VLSI Systems", 1980, Addison-Wesley, pp. 38–45.

As hitherto described, the present invention has the benefit that, immediately above or below each line segment of an already generated wiring path, generation of a wiring path in parallel is restrained on the layer opposite to that on which the segment is present, and the generation of crosstalk reduced, by generating, every time the wiring path for a wiring section is determined, an obstacle to prohibit, with respect to every line segment constituting said wiring path, a segment in the position having the same plane coordinates as the pertinent segment and on the layer opposite to that on which the pertinent segment is present out of the two layers on which wiring is to be achieved, only in the direction parallel to the pertinent line segment and routing the wiring in other subsequent wiring sections while recognizing obstacles prohibiting line segments only in said specified direction.

What is claimed is:

1. A routing method for wiring design, comprising:
   a determining step of identifying, in one of the wiring sections where no wiring path is determined, the direction of the line segment which is prohibited by an obstacle and accordingly determining a wiring path of at least one line segment; and
   a generating step for generating, on an opposing layer to the layer on which one unprocessed line segment is present and in a position having the same plane coordinates as said unprocessed line segment, said obstacle which prohibits on said opposing layer the routing of line segments as are parallel in direction to and in opposing relation to said unprocessed line segment.

2. The routing method for writing design as set forth in claim 1, wherein wiring prohibition data is set at least at one grid point which functions as an obstacle to prohibit the running of wiring.

3. The routing method for wiring design as set forth in claim 2, wherein said prohibition data includes x track prohibition data serving as an obstacle to prohibit the running of wiring in the x direction.

4. The routing method for wiring design as set forth in claim 2, wherein said prohibition data includes y track prohibition data serving as an obstacle to prohibit the running of wiring in the y direction.

5. The routing method for wiring design as set forth in claim 4, wherein said prohibition data includes x track prohibition data serving as an obstacle to prohibit the running of wiring in the x direction, said y direction being perpendicular to said x direction.

6. The routing method for wiring design a set forth in claim 2, wherein at least one obstacle is set to prohibit the running of wiring in an oblique direction, said oblique direction being other than the x direction and the y direction, said x direction being perpendicular to said y direction.

* * * * *